(12) United States Patent
Jeong

(10) Patent No.: US 9,041,423 B2
(45) Date of Patent: May 26, 2015

(54) SEMICONDUCTOR APPARATUS AND TESTING METHOD THEREOF

(75) Inventor: Chun Seok Jeong, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 631 days.

(21) Appl. No.: 13/340,841

(22) Filed: Dec. 30, 2011

(65) Prior Publication Data

US 2013/0002276 A1   Jan. 3, 2013

(30) Foreign Application Priority Data

Jun. 29, 2011   (KR) ........................ 10-2011-0063782

(51) Int. Cl.
*G01R 31/3187* (2006.01)
*G01R 31/317* (2006.01)
*G11C 29/02* (2006.01)
*H01L 21/66* (2006.01)
*G11C 29/50* (2006.01)
*H01L 25/065* (2006.01)
*H01L 23/48* (2006.01)

(52) U.S. Cl.
CPC ........ *G01R 31/31717* (2013.01); *G11C 29/025* (2013.01); *G11C 2029/5002* (2013.01); *H01L 25/0657* (2013.01); *H01L 22/34* (2013.01); *H01L 23/481* (2013.01); *H01L 2924/0002* (2013.01)

(58) Field of Classification Search
None
See application file for complete search history.

(56) References Cited

U.S. PATENT DOCUMENTS

| 3,824,459 | A  | * | 7/1974  | Uchida ........................ 324/678 |
| 8,456,856 | B2 | * | 6/2013  | Lin et al. ...................... 361/783 |
| 8,587,329 | B2 | * | 11/2013 | Winkens ...................... 324/679 |
| 2010/0321042 | A1 |  | 12/2010 | Agarwal et al. |
| 2011/0187389 | A1 | * | 8/2011  | Han et al. ..................... 324/679 |

* cited by examiner

*Primary Examiner* — Paresh Patel
(74) *Attorney, Agent, or Firm* — William Park & Associates Ltd.

(57) ABSTRACT

A semiconductor apparatus includes a through via and a comparison unit. The through via is electrically connected with another chip. The comparison unit includes a reference capacitor, and compares a capacitance value of the through via and a capacitance value of the reference capacitor in response to a test start signal and a reset signal and generates a comparison result.

18 Claims, 6 Drawing Sheets

204a

SEMICONDUCTOR APPARATUS AND TESTING METHOD THEREOF

CROSS-REFERENCES TO RELATED APPLICATION

The present application claims priority under 35 U.S.C. §119(a) to Korean application number 10-2011-0063782, filed on Jun. 29, 2011, in the Korean Intellectual Property Office, which is incorporated herein by reference in its entirety.

BACKGROUND

1. Technical Field

The present invention relates generally to a semiconductor apparatus, and more particularly to a semiconductor apparatus with through vias.

2. Related Art

With increasing capacities and speeds of semiconductor memories used in various electronic systems, various attempts have been made to mount many semiconductor memories within a narrow area and drive efficiently the memory.

In order to highly integrate semiconductor memories, a three-dimensional (3D) layout, in which a plurality of memory chips is stacked, may be substituted for a two-dimensional (2D) layout.

A through via may be used in such a 3D layout structure. The through via has been adopted as an alternative for overcoming degradation of a transmission speed due to a distance to a controller on a module, poor data bandwidth, and degradation of a transmission speed due to variables in a package. In the through via, paths are formed to pass through a plurality of memory chips, and electrodes are formed in the paths so that respective memory chips and a controller can communicate with each other. In a stacked semiconductor memory apparatus to which the through via is applied, wires, sub packages and package balls, which are used in an SIP type and a POP type, are not needed, and electrodes are connected directly over a controller in such a way as to have paths passing through a plurality of memory chips. Bumps are formed between the paths passing through the plurality of memory chips, to electrically connect the plurality of memory chips with the controller.

Since a semiconductor memory apparatus is generally formed of silicon, the through via used in the semiconductor memory apparatus is also referred to as a through-silicon via (TSV).

FIG. 1 is a schematic cross-sectional view explaining processing errors that may occur when forming through vias in a semiconductor apparatus.

FIG. 1 shows a metal layer 10 for forming a through via, a dielectric layer 20 and a substrate 30.

While not shown in FIG. 1, connection layers (not shown) may be electrically connected to the upper and lower ends of the metal layer 10.

The connection layers are formed of a conductive substance for connecting the through via with another through via or a controller. In general, the connection layers are constituted by bumps.

(a) of FIG. 1 shows the case in which the through via is normally formed in a semiconductor chip.

Referring to (a) of FIG. 1, a path passing through the substrate 30 is formed, and the metal layer 10 formed of a metallic substance is normally formed in the path.

In the through via, in order to isolate the metal layer 10 and the wafer layer 30 from each other, the dielectric layer 20 such as an oxide is formed between the metal layer 10 and the substrate 30.

(b) and (c) of FIG. 1 show the cases in which the metal layer 10 is abnormally formed in the path surrounded by the dielectric layer 20.

If a variation occurs in process conditions while forming the through via, the metal layer 10 may be abnormally formed in the course of filling the path surrounded by the dielectric layer 20 with the metal layer 10.

If the metal layer 10 is formed with an open type gap as shown in (b) of FIG. 1, a current path is not created between an electrode e1 and an electrode e2. Therefore, the through via formed as in (b) of FIG. 1 cannot transfer a signal.

If the metal layer 10 is formed with a void type gap as shown in (c) of FIG. 1, although a current path is created between an electrode e3 and an electrode e4, the current path has a large resistance value due to the presence of the void type gap. Therefore, the through via formed as in (c) of FIG. 1 cannot stably transfer a signal.

If a subsequent process is continuously performed for a product in which the processing error is caused in the course of forming through vias in semiconductor chips, the manufacturing yield decreases, the productivity deteriorates, and additional costs are incurred.

SUMMARY

A semiconductor apparatus capable of checking whether or not through vias are normally formed is described herein.

In one embodiment of the present invention, a semiconductor apparatus includes: a through via to be electrically connected with another chip; and a comparison unit including a reference capacitor, and configured to compare a capacitance value of the through via and a capacitance value of the reference capacitor in response to a test start signal and a reset signal and to generate a comparison result.

In another embodiment of the present invention, a method for testing a semiconductor apparatus having a through via to be electrically connected with another chip includes: discharging the through via; connecting electrically serially a reference capacitor with the through via; applying a predetermined voltage to the reference capacitor and the through via which are serially connected; and outputting a voltage divided according to capacitance components of the reference capacitor and the through via, as a comparison result.

BRIEF DESCRIPTION OF THE DRAWINGS

Features, aspects, and embodiments are described in conjunction with the attached drawings, in which.

DETAILED DESCRIPTION

Hereinafter, a semiconductor apparatus and a testing method thereof according to the present invention will be described below with reference to the accompanying drawings through exemplary embodiments.

Figure 2:
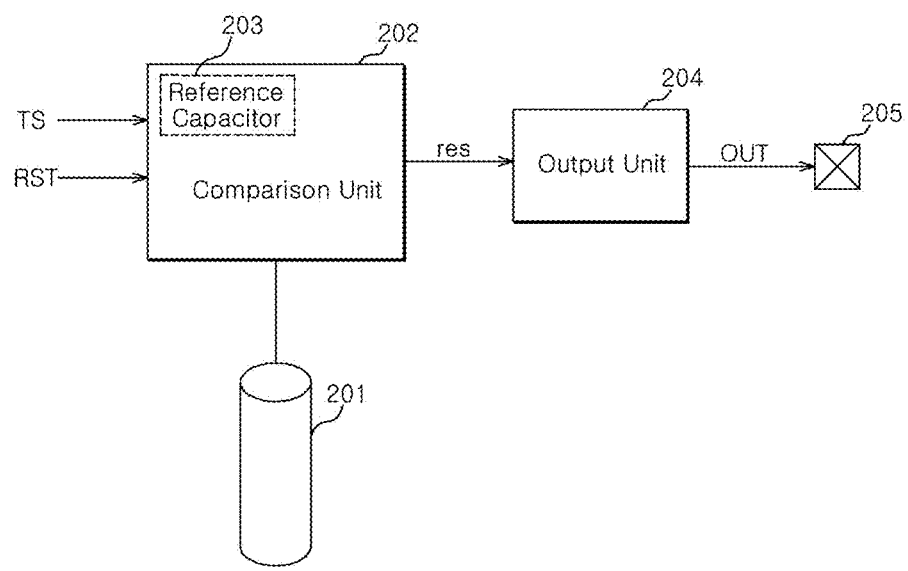
FIG. 2 is a schematic block diagram showing a semiconductor apparatus in accordance with an embodiment of the present invention.

FIG. 2 is a schematic block diagram showing a semiconductor apparatus in accordance with an embodiment of the present invention.

The semiconductor apparatus 1 in accordance with an embodiment of the present invention may be configured to compare the capacitance value of a reference capacitor 203 and the capacitance value of a through via 201 and generate a comparison result res.

Figure 1:
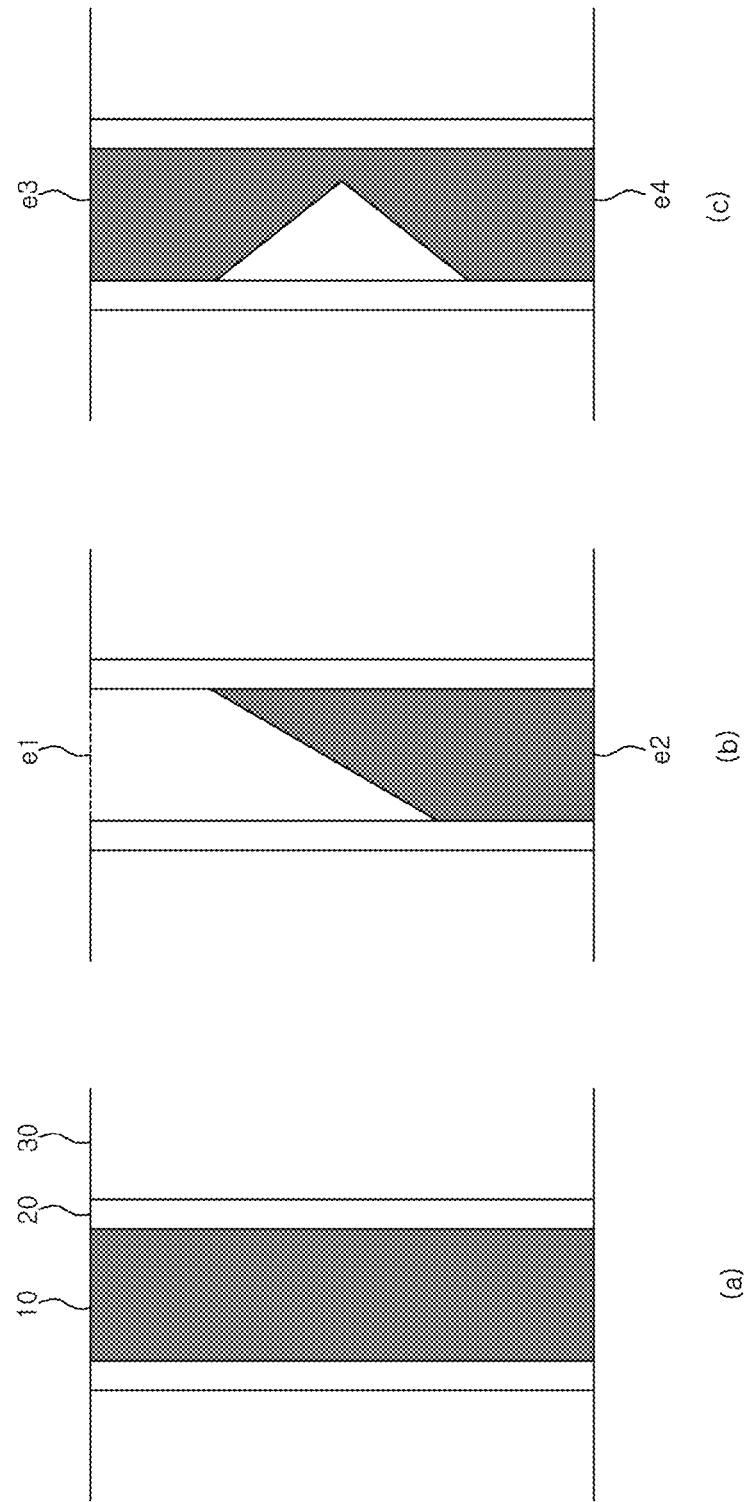
FIG. 1 is a schematic cross-sectional view explaining processing errors that may occur when forming through vias in a semiconductor apparatus.

In the through vias shown in FIG. 1, the metal layers 10 surrounded by the dielectric layers 20 have capacitance components.

Also, in the through vias shown in FIG. 1, the volumes occupied by the metal layers 10 in the cases of (a), (b) and (c) are different from one another.

The fact that the volumes occupied by the metal layers 10 are different from one another means that the capacitance components of the metal layers 10 are different from one another.

Since the volumes of the metal layers 10 in the cases of (b) and (c) are smaller than the volume of the metal layer 10 in the case of (a), the capacitance values of the through vias in the cases of (b) and (c) are smaller than the capacitance value of the through via in the case of (a).

The semiconductor apparatus 1 in accordance with an embodiment of the present invention uses such a principle, and may compare the capacitance value of the reference capacitor 203 and the capacitance value of the through via 201 and determine whether or not the through via 201 is normally formed. For example, in the semiconductor apparatus 1, the reference capacitor 203 and the through via 201 are coupled in series, and the capacitance value of the through via 201 may be estimated by applying a predetermined level of voltage and checking a generated voltage.

The semiconductor apparatus 1 may include the through via 201 and a comparison unit 202.

The through via 201 may be formed to pass through the semiconductor apparatus 1 as shown in FIG. 1 and is only conceptually shown in FIG. 2.

The through via 201 may include a through via (for example, the metal layer 10 of FIG. 1) electrically connected with another chip. Therefore, the through via 201 includes a capacitance component.

The comparison unit 202 includes the reference capacitor 203, and may be configured to compare the capacitance values between the through via 201 and the reference capacitor 203 in response to a test start signal TS and a reset signal RST and generate the comparison result res.

The through via 201 may be formed through a separate process, and the reference capacitor 203 may be formed while performing a semiconductor manufacturing process generally known in the art, that is, while forming devices such as various transistors, resistors, etc. Thus, the capacitance value of the reference capacitor 203 may be determined as a value that is already known to a designer.

By comparing the capacitance value of the reference capacitor 203 and the capacitance value of the through via 201 that may vary depending upon a through via forming process, it is possible to determine whether or not the through via 201 is normally formed.

The comparison result res may be outputted to an outside. In the case where the comparison result res is outputted to an outside, a semiconductor apparatus manufacturer may check the comparison result res and determine whether or not the through via of a corresponding chip is normally formed and whether or not to perform a subsequent process. Therefore, an unnecessary process for a failed chip is prevented, and thus the manufacturing costs of the semiconductor apparatus may be reduced and the productivity may be improved.

The semiconductor apparatus 1 may further include an output unit 204 for outputting the comparison result res to an outside.

The output unit 204 is configured to receive the comparison result res and generate an output signal OUT.

Because the comparison result res is a signal generated inside the semiconductor apparatus 1, the value thereof may not be clear logically (for example, as an analog voltage), and the driving force thereof may be insufficient to be outputted to an outside. Accordingly, the semiconductor apparatus 1 may further include the output unit 204 to allow the comparison result res to be normally received from the outside.

Also, the semiconductor apparatus 1 may further include a pad 205 for outputting the output signal OUT to the outside.

Figure 3:
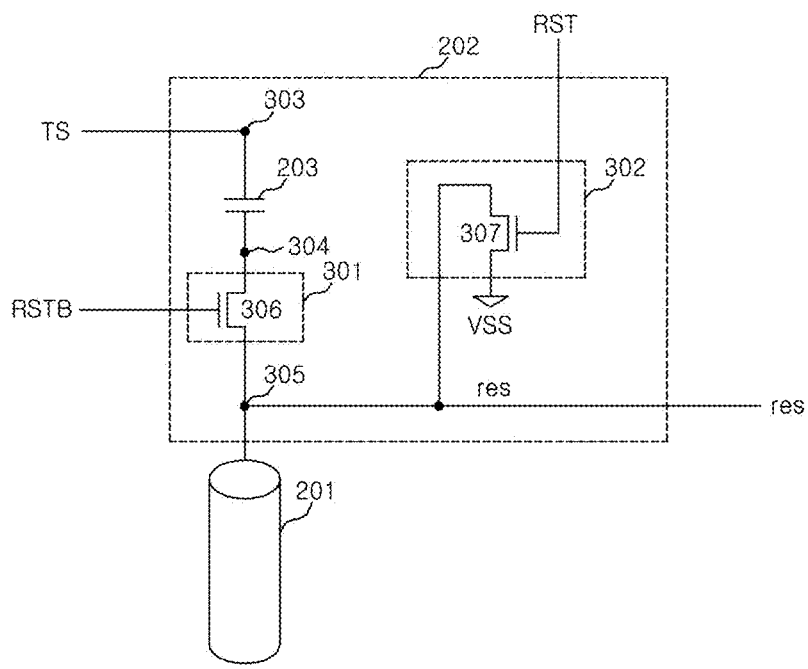
FIG. 3 is a detailed view showing the through via and the comparison unit shown in FIG. 2.

FIG. 3 is a detailed view showing the through via 201 and the comparison unit 202 shown in FIG. 2.

As described above, the comparison unit 202 includes the reference capacitor 203.

Moreover, the comparison unit 202 shown in FIG. 3 may further include a switch section 301 and an initializing section 302.

The reference capacitor 203 is coupled between a first node 303 and a second node 304.

The test start signal TS is applied to the first node 303.

The through via 201 is coupled to a third node 305.

The voltage level of the third node 305 is outputted as the comparison result res.

The switch section 301 is configured to electrically connect the second node 304 and the third node 305 with each other in response to a reset signal RSTB.

The switch section 301 may include an NMOS transistor 306.

The NMOS transistor 306 is coupled between the second node 304 and the third node 305 and receives the reset signal RSTB through the gate terminal thereof.

The initializing section 302 is configured to initialize the voltage level of the third node 305 (for example, to a low level) in response to the reset signal RST.

The initializing section 302 may include an NMOS transistor 307.

The NMOS transistor 307 is coupled between the third node 305 and a ground voltage VSS and receives the reset signal RST through the gate terminal thereof.

The reset signal RSTB is the inverted signal of the reset signal RST.

As shown in FIG. 3, the comparison unit 202 may be configured to electrically connect or disconnect the reference capacitor 203 including the switch section 301 and the through via 201 with or from each other.

In the case where the through via 201 and the reference capacitor 203 are electrically disconnected from each other, since the capacitance value of the reference capacitor 203 does not exert any influence on the signal transmitted through the through via 201 in the subsequent normal operation of the semiconductor apparatus, an advantage may be provided when transferring a signal through the through via 201.

Figure 4:
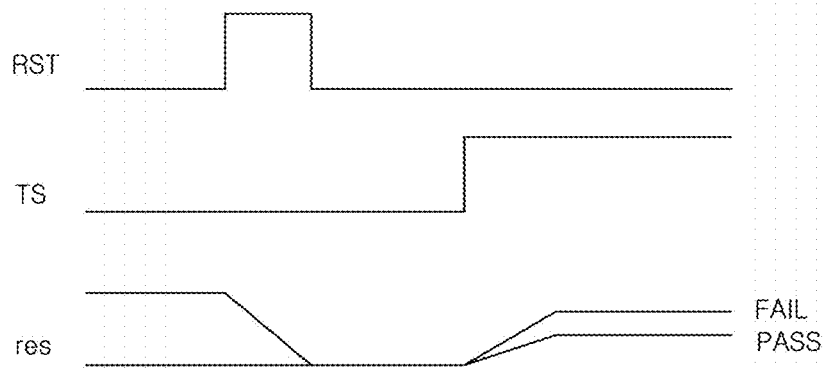
FIG. 4 is a timing diagram explaining operations of the comparison unit shown in FIG. 3.

FIG. 4 is a timing diagram explaining operations of the comparison unit 202 shown in FIG. 3.

The reset signal RST is activated to a high level for a predetermined time.

The NMOS transistor 306 is turned off, and the NMOS transistor 307 is turned on. As a current path is formed from the third node 305 through the NMOS transistor 307 to the ground voltage VSS, the third node 305 is discharged to the low level.

Thereafter, the reset signal RST is deactivated to a low level.

The NMOS transistor 306 is turned on and electrically connects the second node 304 and the third node 305 with each other. That is, the reference capacitor 203 and the through via 201 are coupled in series.

Then, the test start signal TS is activated to a high level. It is assumed that the high level of the test start signal TS corresponds to the level of a power supply voltage VDD.

Accordingly, the voltage level of the third node 305 is changed. The voltage level of the third node 305 varies depending upon the capacitance values of the reference capacitor 203 and the through via 201.

When assuming that the capacitance value of the reference capacitor 203 is C1 and the capacitance value of the through via 201 is C2, the voltage level of the third node 305 (that is, the comparison result res) is determined by the following equation.

$$res = VDD*C1/(C1+C2)$$

Since the capacitance value C1 of the reference capacitor 203 is a fixed value, the voltage level res of the third node 305 decreases as the capacitance value C2 of the through via 201 increases. Conversely, the voltage level res of the third node 305 increases as the capacitance value C2 of the through via 201 decreases. Furthermore, the capacitance value C1 of the reference capacitor is equal to or less than a designed capacitance value C2 of the through via 201.

In the cases of (b) and (c) of FIG. 1, the capacitance value C2 of the through via 201 is smaller than a designed value. Therefore, the voltage level res of the third node 305 is larger in the cases of (b) and (c) than in the case of (a).

FIG. 4 shows the comparison result res generated in a normal case PASS and in a failed case FAIL. In FIG. 4, the comparison result res, that is, the voltage level of the third node 305 is larger in the failed case FAIL than in the normal case PASS.

It is to be noted that the exemplification shown in FIG. 4 that the comparison result res generated according to the through via 201 is larger in the failed case FAIL than in the normal case PASS is not intended to restrict output waveforms in the present invention.

For example, while not shown in FIG. 1, the metal layer 1 may be formed excessively than in the case of (a). In this case, the capacitance value of the through via 201 may be larger than the capacitance value of the reference capacitor 203.

However, even in this case, the principle, which is disclosed by the semiconductor apparatus 1 in accordance with an embodiment of the present invention and in which the capacitance values between the reference capacitor 203 and the through via 201 are compared and the comparison result res is generated, may be applied. A semiconductor apparatus manufacturer may estimate the capacitance value that the through via 201 has, by outputting the comparison result res to an outside and checking the comparison result res.

Figure 5:
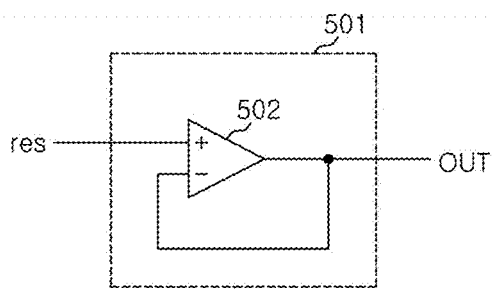
FIG. 5 is a circuit diagram showing an output unit shown in FIG. 2 according to an exemplary embodiment of the present invention.

FIG. 5 is a circuit diagram showing an output unit 204 shown in FIG. 2 according to an exemplary embodiment of the present invention.

In FIG. 5, an output unit 204a may include a buffer circuit 501.

The buffer circuit 501 is configured to amplify the voltage level of the third node 305 and output the output signal OUT.

As the buffer circuit 501 outputs the output signal OUT by amplifying the voltage level of the third node 305, the output signal OUT has a sufficiently large driving force to be outputted to the outside.

The third node 305 is a node electrically connected with the reference capacitor 203 and the through via 201 according to the reset signal RSTB. Also, the voltage level of the third node 305 is influenced by the capacitance value of the reference capacitor 203 and the capacitance value of the through via 201.

If the third node 305 is directly connected with the pad 205 and an external test equipment is connected to the third node 305 through probe contact, the third node 305 is connected with an additional capacitance component by the external test equipment. Because the additional capacitance component by the external test equipment has a sufficiently large value (for example, to several tens times) when compared to the capacitance components of the reference capacitor 203 and the through via 201, the additional capacitance component may exert an influence on the voltage level of the third node 305. Hence, the output unit 204a may be configured to include the buffer circuit 501 and amplify the comparison result res.

As shown in FIG. 5, the buffer circuit 501 may include a unity gain buffer 502.

A unity gain buffer is a buffer circuit configured to output the voltage level of an input signal as it is as an output signal, by amplifying the driving force thereof.

Figure 6:
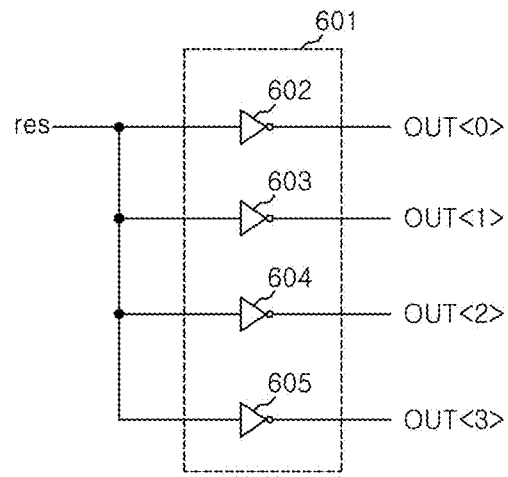
FIG. 6 is a circuit diagram showing an output unit shown in FIG. 2 according to an exemplary embodiment of the present invention.

FIG. 6 is a circuit diagram showing an output unit 204 shown in FIG. 2 according to an exemplary embodiment of the present invention.

In FIG. 6, an output unit 204b may include an AD converter 601.

The AD converter 601 is configured to convert the voltage level res of the third node 305 into digital codes and output signals OUT<0:3>.

Since the voltage level res of the third node 305 is a level which is voltage-divided by the capacitance value of the reference capacitor 203 and the capacitance value of the through via 201, it belongs to an analog voltage.

The output unit 204b includes the AD converter 601, and may convert the voltage level res of the third node 305 as the analog voltage into digital codes and output the output signals OUT<0:3>.

The AD converter 601 may include a plurality of logic gates configured to transition the logic values of the output signals at different levels depending upon the voltage level res of the third node 305.

For example, the AD converter 601 may include four inverters 602 to 605.

The four inverters 602 to 605 receive the comparison result res as input signals, perform inverting operations and generate the respective bits of the output signals OUT<0:3>.

The four inverters 602 to 605 may include PMOS transistors and NMOS transistors. The PMOS transistors and the NMOS transistors may be configured to control the channel ratios thereof and transition the logic values of the output signals OUT<0:3> according to different input levels. In other words, the four inverters 602 to 605 may be configured to have different threshold voltages, respectively.

Figure 7:
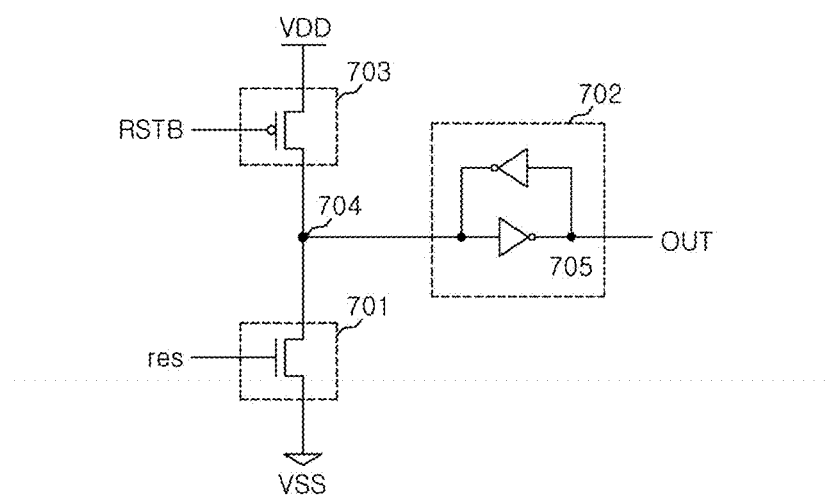
FIG. 7 is a circuit diagram showing an output unit shown in FIG. 2 according to an exemplary embodiment of the present invention.

FIG. 7 is a circuit diagram showing an output unit 204 shown in FIG. 2 according to an exemplary embodiment of the present invention.

In FIG. 7, an output unit 204c is configured to output the output signal OUT indicating whether or not the voltage level res of the third node 305 is equal to or smaller than a predetermined level.

As shown in FIG. 7, the output unit 204c may include a determination node sink section 701 and a latch section 702.

The determination node sink section 701 is configured to discharge a determination node 704 depending upon the voltage level res of the third node 305.

The determination node sink section 701 may include an NMOS transistor. The NMOS transistor is coupled between the determination node 704 and the ground voltage VSS and receives the comparison result res, that is, the voltage level of the third node 305 through the gate terminal thereof.

The latch section 702 includes a latch circuit 705 electrically connected with the determination node 704, and generates the output signal OUT using the latch value of the latch circuit 705.

The latch circuit 705 may be configured to latch the voltage level of the determination node 704, invert the voltage level of the determination node 704, and output the output signal OUT.

In the case where the output unit 204c includes the latch circuit 705 configured to latch a voltage level of the determination node 704, the voltage level of the determination node 704 is changed not in proportional to the discharge driving force of the determination node sink section 701 but when the discharge driving force of the determination node sink section 701 becomes larger than the latch driving force of the latch circuit 705 with respect to the determination node 704. The latch value of the latch circuit 705 varies depending upon whether or not the voltage level of the third node 305 is equal to or smaller than the predetermined level.

When the output unit 204c is configured to compare the discharge driving force of the determination node sink section 701 and the latch driving force of the latch circuit 705 and generate the output signal OUT, the following advantages are provided.

First, the voltage level of the output signal OUT may be generated to be advantageous for discrimination of a logic value. If the level of the output signal OUT is momentarily changed from a high level to a low level or from a low level to a high level, advantages are provided in discriminating the logic value of the output signal OUT.

Second, by changing the design value of the latch circuit, it is possible to determine when the logic value of the output signal OUT is changed when what value the capacitance component of the through via 201 has.

Since the discharge driving force of the determination node sink section 701 is determined depending upon the capacitance value of the through via 201, by changing the design value of the latch circuit 705, that is, the latch driving force of the latch circuit 705, it is possible to determine the normal standard of the capacitance value of the through via 201.

For example, the design standard of the latch circuit 705 may be set such that, when the voltage level of the third node 305 is higher than the predetermined level, the discharge driving force by the determination node sink section 701 for the determination node 704 is sufficiently large to change the latch value of the latch circuit 705.

The output unit 204c outputs the output signal OUT with a logic value of a high or low level indicating whether or not the comparison result res has the predetermined level, that is, whether or not the capacitance value of the through via 201 is larger than predetermined capacity. Accordingly, the semiconductor apparatus manufacturer may determine whether or not the through via 201 is normally formed, for example, only by checking the high and low levels of the output signal OUT.

The output unit 204c may further include a determination node initializing section 703 for initializing the voltage level of the determination node 704.

The determination node initializing section 703 is configured to initialize the voltage level of the determination node 704 in response to the reset signal RSTB.

The determination node initializing section 703 may include a PMOS transistor 703. The PMOS transistor 703 is coupled between the power supply voltage VDD and the determination node 704 and receives the reset signal RSTB through the gate terminal thereof.

The PMOS transistor 703 is turned on and initializes the determination node 704 to a high level when the reset signal RSTB of a low level is received.

Figure 8:
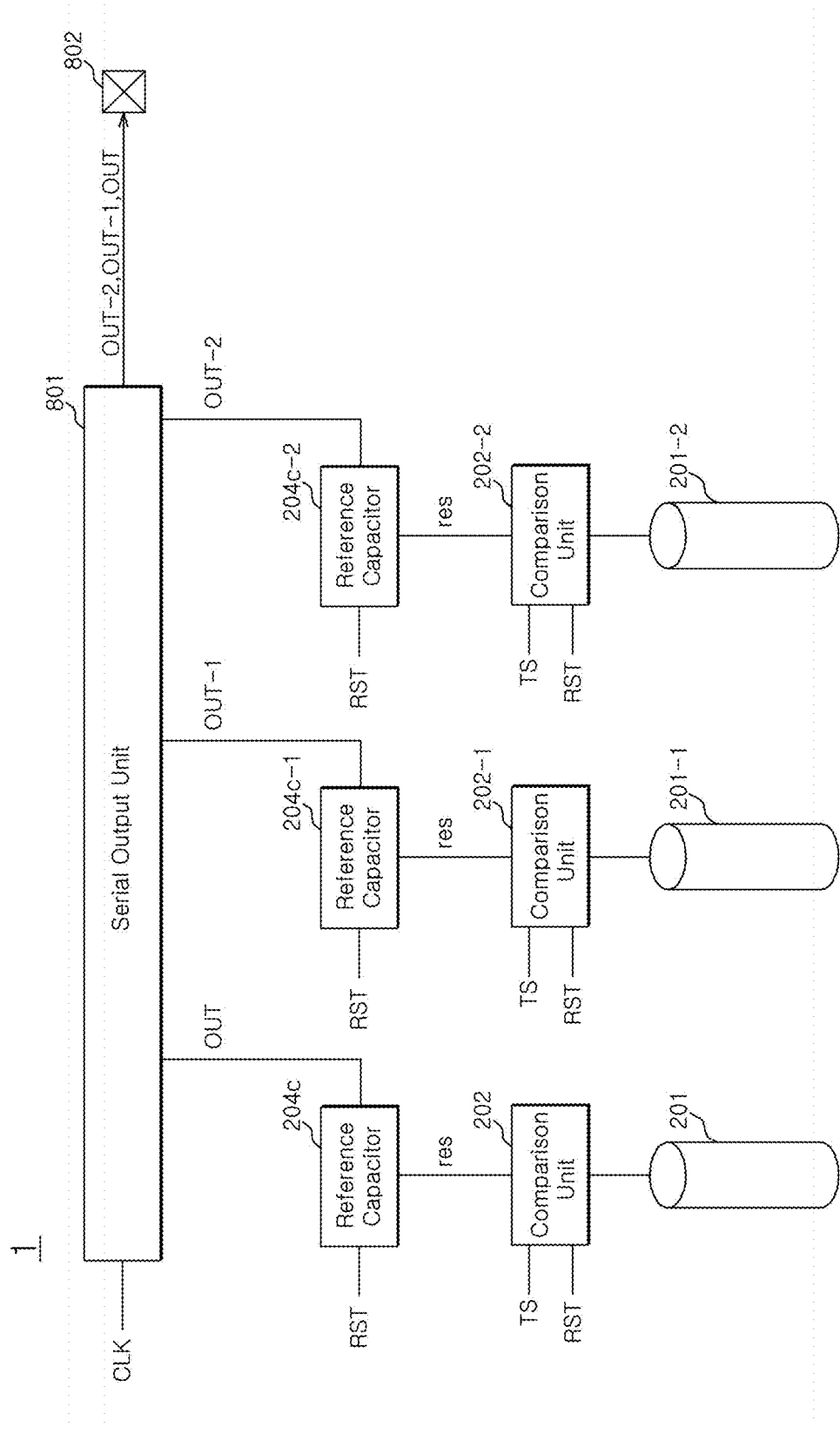
FIG. 8 is a schematic block diagram showing the case in which the semiconductor apparatus includes a plurality of through vias.

FIG. 8 is a schematic block diagram showing the case in which the semiconductor apparatus 1 includes a plurality of through vias.

In the case where the semiconductor apparatus 1 includes a plurality of through vias 201 and a plurality of comparison units 202, a plurality of output signals OUT are generated.

The semiconductor apparatus 1 may further include a serial output unit 801 for outputting the plurality of output signals OUT.

The serial output unit 801 is configured to receive and latch the plurality of output signals OUT which are outputted from a plurality of output units 204 allocated to the plurality of through vias 201 and the plurality of comparison units 202, and serially output the plurality of output signals OUT in response to a clock signal CLK.

In order to separately designate a plurality of configuration parts, a plurality of through vias 201, 201-1 and 201-2, a plurality of comparison units 202, 202-1 and 202-2, a plurality of output units 204c, 204c-1 and 204c-2, and a plurality of output signals OUT, OUT-1 and OUT-2 are shown in FIG. 8.

The semiconductor apparatus 1 may further include a pad 802 for outputting the output signals OUT, OUT-1 and OUT-2 of the serial output unit 801, to an outside.

When the plurality of output signals OUT, OUT-1 and OUT-2 are outputted in series, since the one pad 802 may be shared, the number of pads necessary for outputting the plurality of output signals OUT, OUT-1 and OUT-2 may decrease.

Figure 9:
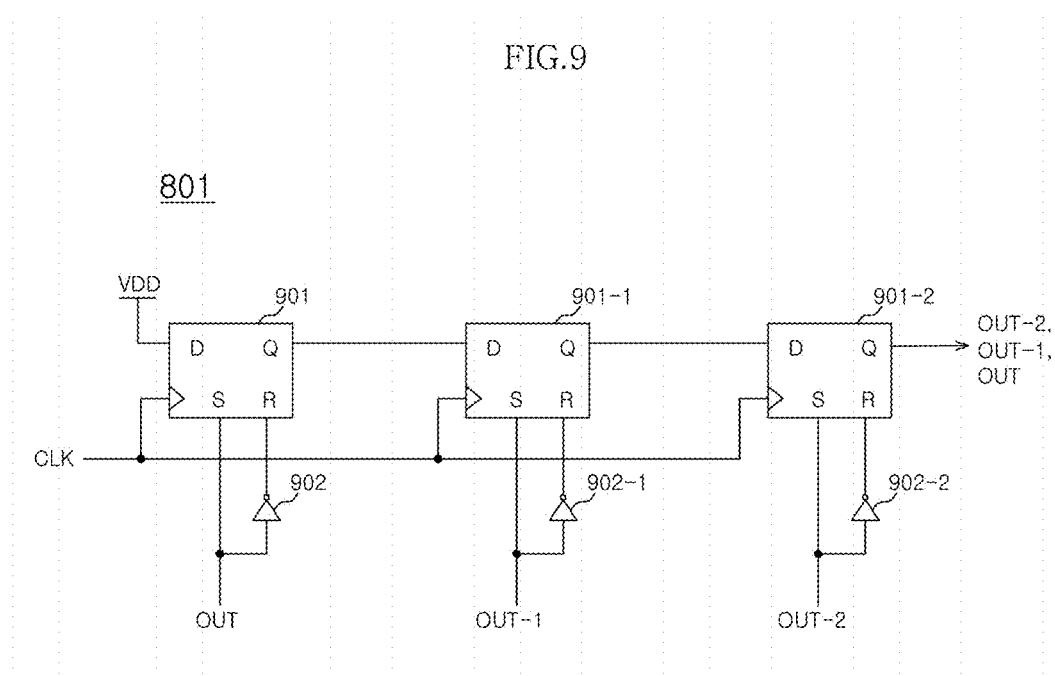
FIG. 9 is a circuit diagram showing an serial output unit shown in FIG. 8 according to an exemplary embodiment of the present invention.

FIG. 9 is a circuit diagram showing an serial output unit 801 shown in FIG. 8 according to an exemplary embodiment of the present invention.

The serial output unit 801 shown in FIG. 9 is configured, without a limiting sense, to receive and latch the three output signals OUT, OUT-1 and OUT-2 and serially output the three output signals OUT, OUT-1 and OUT-2 in response to the clock signal CLK.

The serial output unit 801 may include one flip-flop and one inverter which correspond to each of the output signals OUT, OUT-1 and OUT-2. As shown in FIG. 9, the serial output unit 801 configured to receive and serially output the three output signals OUT, OUT-1 and OUT-2 may include three flip-flops 901, 901-1 and 901-2 and three inverters 902, 902-1 and 902-2.

The flip-flops 901, 901-1 and 901-2 may include delay flip-flop circuits which have set terminals S and reset terminals S.

The three flip-flops 901, 901-1 and 901-2 are configured to have serial input/output relationships.

The inverters 902, 902-1 and 902-2 allocated to the respective output signals OUT, OUT-1 and OUT-2 invert the output signals OUT, OUT-1 and OUT-2.

The three flip-flops 901, 901-1 and 901-2 receive the output signals OUT, OUT-1 and OUT-2 respectively allocated thereto, through the set terminals S, and receive the outputs of the inverters 902, 902-1 and 902-2 through the reset terminals R.

The three flip-flops 901, 901-1 and 901-2 latch the values of 1 or 0 depending upon the signals received through the set terminals S and the reset terminals R, and serially output one bit by one bit as the output signals OUT-2, OUT-1 and OUT in response to toggling of the clock signal CLK.

While certain embodiments have been described above, it will be understood to those skilled in the art that the embodiments described are by way of example only. Accordingly, the semiconductor apparatus and the testing method thereof described herein should not be limited based on the described embodiments. Rather, the semiconductor apparatus and the testing method thereof described herein should only be limited in light of the claims that follow when taken in conjunction with the above description and accompanying drawings.

What is claimed is:

1. A semiconductor apparatus comprising:
   a plurality of through vias to be electrically connected with another chip;
   a plurality of comparison units configured to compare capacitance values of each of the through vias and capacitance values of each of reference capacitors to generate comparison results, wherein each of the plurality of the comparison units includes one reference capacitor and is configured to compare a capacitance value of one through via and a capacitance value of the one reference capacitor in response to a test start signal and a reset signal and generate one comparison result;
   a plurality of output units configured to receive the comparison results and generate output signals; and
   a serial output unit configured to serially output the output signals to a pad in response to a clock signal.

2. The semiconductor apparatus according to claim 1, wherein the comparison unit initializes a voltage level of the through via in response to the reset signal, and compares the capacitance value of the through via and the capacitance value of the reference capacitor in response to the test start signal.

3. The semiconductor apparatus according to claim 2,
   wherein the reference capacitor is coupled between a first node and a second node, and
   wherein the through via is coupled to a third node, and
   wherein a voltage level of the third node is outputted as the comparison result, and
   wherein the comparison unit comprises:
   a switch section configured to electrically connect the second node and the third node with each other in response to the reset signal; and
   an initializing section configured to initialize the voltage level of the third node in response to the reset signal, wherein the test start signal is applied to the first node.

4. The semiconductor apparatus according to claim 1, wherein the output unit generates the output signal indicating whether or not the voltage level of the third node is equal to or smaller than a predetermined level.

5. The semiconductor apparatus according to claim 4,
   wherein the output unit comprises:
   a determination node sink section configured to discharge a determination node depending upon the voltage level of the third node; and
   a latch section comprising a latch circuit configured to be electrically connected with the determination node, and
   wherein the output unit generates the output signal using a latch value of the latch circuit.

6. The semiconductor apparatus according to claim 5, wherein, when the voltage level of the third node is equal to or smaller than the predetermined level, a discharge driving force of the determination node sink section for the determination node is sufficiently large to change the latch value of the latch circuit.

7. The semiconductor apparatus according to claim 5, wherein the output unit further comprises:
   a determination node initializing section configured to initialize a voltage level of the determination node in response to the reset signal.

8. The semiconductor apparatus according to claim 1, wherein the serial output unit comprises a plurality of flip-flops coupled in series and respectively configured to receive the plurality of output signals.

9. The semiconductor apparatus according to claim 1, further comprising:
   a pad configured to output the output signals of the serial output unit to an outside.

10. The semiconductor apparatus according to claim 1, wherein the output unit comprises a buffer circuit configured to amplify the voltage level of the third node and output the output signal.

11. The semiconductor apparatus according to claim 10, wherein the buffer circuit comprises a unity gain buffer.

12. The semiconductor apparatus according to claim 10, further comprising:
   a pad configured to receive the output signal.

13. The semiconductor apparatus according to claim 1, wherein the output unit comprises an AD converter configured to convert the voltage level of the third node into digital codes and output the output signal.

14. The semiconductor apparatus according to claim 13, wherein the AD converter comprises a plurality of logic gates configured to transition a logic value of the output signal at different levels as the voltage level of the third node increases or decreases.

15. A method for testing a semiconductor apparatus having a plurality of through vias to be electrically connected with another chip, comprising:
   discharging the plurality of through vias;
   connecting electrically each of the plurality of through vias with each of reference capacitors in serial;
   applying a predetermined voltage to the reference capacitors and the through vias; and
   outputting voltages divided according to capacitance components of the reference capacitors and the through vias, as comparison results;
   generating a plurality of output signals based on the comparison results; and
   outputting serially the comparison results to a pad in response to a clock signal.

16. The method according to claim 15, further comprising:
outputting the comparison result through a buffer circuit which is connected with a predetermined pad.

17. The method according to claim 15, wherein the comparison result is outputted by being converted into digital codes.

18. The method according to claim 15, further comprising:
discharging to a latch circuit with a predetermined latch driving force by changing a driving force depending upon one of the comparison results; and
outputting one output signal indicating whether or not a latch value of the latch circuit is changed.

* * * * *